(12) United States Patent
Ulrich (10) Patent No.: US 9,985,634 B2
(45) Date of Patent: May 29, 2018

(54) DATA-DRIVEN VOLTAGE REGULATOR (71) Applicant: Kandou Labs, S.A., Lausanne (CH)

(72) Inventor: Roger Ulrich, Schliern bei Koniz (CH)

(73) Assignee: KANDOU LABS, S.A., Lausanne (CH)

( * ) Notice: Subject to any disclaimer, the term of this patent is extended or adjusted under 35 U.S.C. 154(b) by 716 days.

(21) Appl. No.: 14/470,795

(22) Filed: Aug. 27, 2014

(65) Prior Publication Data

US 2015/0066230 A1 Mar. 5, 2015

Related U.S. Application Data

(60) Provisional application No. 61/870,612, filed on Aug. 27, 2013.

(51) Int. Cl.
| | |
|---|---|
| *G05F 1/66* | (2006.01) |
| *G05F 1/625* | (2006.01) |
| *H03K 19/0185* | (2006.01) |
| *H04L 25/02* | (2006.01) |
| *H04L 25/49* | (2006.01) |
| *H02M 3/07* | (2006.01) |

(52) U.S. Cl.
CPC ... *H03K 19/018514* (2013.01); *H04L 25/028* (2013.01); *H04L 25/0272* (2013.01); *H04L 25/4917* (2013.01); *H02M 3/07* (2013.01)

(58) Field of Classification Search
CPC ....... G05F 1/66; G05F 1/625; H04L 25/0272; H04L 25/028; H04L 25/4917; H02M 3/07; H03K 19/018514
See application file for complete search history.

(56) References Cited

U.S. PATENT DOCUMENTS

| | | |
|---|---|---|
| 668,687 A | 2/1901 | Mayer |
| 780,883 A | 1/1905 | Hinchman |
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara et al. |
| 4,181,967 A | 1/1980 | Nash et al. |
| 4,206,316 A | 6/1980 | Burnsweig et al. |
| 4,276,543 A | 6/1981 | Miller |
| 4,486,739 A | 12/1984 | Franaszeck et al. |
| 4,499,550 A | 2/1985 | Ray et al. |

(Continued)

FOREIGN PATENT DOCUMENTS

| | | |
|---|---|---|
| CN | 1864346 | 11/2006 |
| CN | 101478286 | 7/2009 |

(Continued)

OTHER PUBLICATIONS

International Search Report and Written Opinion for PCT/US14/052986 dated Nov. 24, 2014.

(Continued)

*Primary Examiner* — Umut Onat
(74) *Attorney, Agent, or Firm* — Invention Mine, LLC (57) ABSTRACT

An efficient regulated power supply for a communications interface is disclosed using a data-dependent charge pump design. Data patterns known to produce increased power supply load concurrently raise power supply source current, leading to significant overall power savings for the combined communications driver and regulator over known switched and linear regulator solutions.

14 Claims, 6 Drawing Sheets

(56) References Cited

U.S. PATENT DOCUMENTS

| | | |
|---|---|---|
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 5,053,974 A | 10/1991 | Penz |
| 5,166,956 A | 11/1992 | Baltus et al. |
| 5,168,509 A | 12/1992 | Nakamura et al. |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan et al. |
| 5,449,895 A | 9/1995 | Hecht |
| 5,459,465 A | 10/1995 | Kagey |
| 5,461,379 A | 10/1995 | Weinman |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss et al. |
| 5,626,651 A | 5/1997 | Dullien |
| 5,629,651 A | 5/1997 | Mizuno |
| 5,659,353 A | 8/1997 | Kostreski et al. |
| 5,727,006 A | 3/1998 | Dreyer |
| 5,802,356 A | 9/1998 | Gaskins |
| 5,825,808 A | 10/1998 | Hershey et al. |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,999,016 A | 12/1999 | McClintock |
| 6,005,895 A | 12/1999 | Perino et al. |
| 6,084,883 A | 7/2000 | Norrell et al. |
| 6,172,634 B1 | 1/2001 | Leonowich et al. |
| 6,175,230 B1 | 1/2001 | Hamblin et al. |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino et al. |
| 6,378,073 B1 | 4/2002 | Davis |
| 6,398,359 B1 | 6/2002 | Silverbrook |
| 6,404,820 B1 | 6/2002 | Postol |
| 6,404,920 B1 | 6/2002 | Hsu |
| 6,417,737 B1 | 7/2002 | Moloudi et al. |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino et al. |
| 6,509,773 B2 | 1/2003 | Buchwald |
| 6,556,628 B1 | 4/2003 | Poulton et al. |
| 6,563,382 B1 | 5/2003 | Yang et al. |
| 6,621,427 B2 | 9/2003 | Greenstreet |
| 6,624,699 B2 | 9/2003 | Yin |
| 6,650,638 B1 | 11/2003 | Walker et al. |
| 6,661,355 B2 | 12/2003 | Cornelius et al. |
| 6,664,355 B2 | 12/2003 | Kim |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwald et al. |
| 6,865,234 B1 | 3/2005 | Agazzi |
| 6,865,236 B1 | 3/2005 | Terry |
| 6,954,492 B1 | 10/2005 | Williams |
| 6,972,701 B2 | 12/2005 | Jansson |
| 6,990,138 B2 | 1/2006 | Bejjani |
| 6,991,038 B2 | 1/2006 | Guesnon |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,080,288 B2 | 7/2006 | Ferraiolo |
| 7,082,557 B2 | 7/2006 | Schauer |
| 7,085,153 B2 | 8/2006 | Ferrant et al. |
| 7,127,003 B2 | 10/2006 | Rajan |
| 7,142,612 B2 | 11/2006 | Horowitz et al. |
| 7,142,865 B2 | 11/2006 | Tsai |
| 7,167,019 B2 | 1/2007 | Broyde et al. |
| 7,176,823 B2 | 2/2007 | Zabroda |
| 7,180,949 B2 | 2/2007 | Kleveland et al. |
| 7,184,483 B2 | 2/2007 | Rajan |
| 7,199,728 B2 | 4/2007 | Dally |
| 7,231,558 B2 | 6/2007 | Gentieu |
| 7,335,976 B2 | 2/2008 | Chen |
| 7,336,112 B1 | 2/2008 | Sha |
| 7,346,819 B2 | 3/2008 | Bansal |
| 7,356,213 B1 | 4/2008 | Cunningham et al. |
| 7,358,869 B1 | 4/2008 | Chiarulli et al. |
| 7,362,130 B2 | 4/2008 | Broyde et al. |
| 7,362,697 B2 | 4/2008 | Becker |
| 7,372,390 B2 | 5/2008 | Yamada |
| 7,389,333 B2 | 6/2008 | Moore et al. |
| 7,397,302 B2 | 7/2008 | Bardsley |
| 7,400,276 B1 | 7/2008 | Sotiriadis |
| 7,428,273 B2 | 9/2008 | Foster |
| 7,539,532 B2 | 5/2009 | Tran |
| 7,570,704 B2 | 8/2009 | Nagarajan |
| 7,613,234 B2 | 11/2009 | Raghavan |
| 7,620,116 B2 | 11/2009 | Bessios |
| 7,633,850 B2 | 12/2009 | Ahn |
| 7,643,588 B2 | 1/2010 | Visalli |
| 7,656,321 B2 | 2/2010 | Wang |
| 7,697,915 B2 | 4/2010 | Behzad |
| 7,698,088 B2 | 4/2010 | Sul |
| 7,706,524 B2 | 4/2010 | Zerbe |
| 7,746,764 B2 | 6/2010 | Rawlins et al. |
| 7,787,572 B2 | 8/2010 | Scharf et al. |
| 7,808,456 B2 | 10/2010 | Chen |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen et al. |
| 7,933,770 B2 | 4/2011 | Kruger et al. |
| 8,000,664 B2 | 8/2011 | Khorram |
| 8,030,999 B2 | 10/2011 | Chatterjee |
| 8,064,535 B2 | 11/2011 | Wiley |
| 8,091,006 B2 | 1/2012 | Prasad et al. |
| 8,106,806 B2 | 1/2012 | Toyomura |
| 8,149,906 B2 | 4/2012 | Saito |
| 8,159,375 B2 | 4/2012 | Abbasafar |
| 8,159,376 B2 | 4/2012 | Abbasfar |
| 8,199,849 B2 | 6/2012 | Oh |
| 8,233,544 B2 | 7/2012 | Bao |
| 8,253,454 B2 | 8/2012 | Lin |
| 8,279,094 B2 | 10/2012 | Abbasfar |
| 8,289,914 B2 | 10/2012 | Li |
| 8,295,250 B2 | 10/2012 | Gorokhov |
| 8,310,389 B1 | 11/2012 | Chui |
| 8,341,492 B2 | 12/2012 | Shen |
| 8,359,445 B2 | 1/2013 | Ware |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,462,891 B2 | 6/2013 | Kizer et al. |
| 8,620,166 B2 | 6/2013 | Dong |
| 8,498,368 B1 | 7/2013 | Husted |
| 8,520,493 B2 | 8/2013 | Goulahsen |
| 8,547,272 B2 | 10/2013 | Nestler et al. |
| 8,578,246 B2 | 11/2013 | Mittelholzer |
| 8,588,280 B2 | 11/2013 | Oh et al. |
| 8,593,305 B1 | 11/2013 | Tajalli et al. |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,460 B2 | 2/2014 | Ware |

(56) References Cited

U.S. PATENT DOCUMENTS

| | | |
|---|---|---|
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,718,184 B1 | 5/2014 | Cronie |
| 8,755,426 B1 | 6/2014 | Cronie |
| 8,780,687 B2 | 7/2014 | Clausen |
| 8,782,578 B2 | 7/2014 | Tell |
| 8,831,440 B2 | 9/2014 | Yu |
| 8,879,660 B1 | 11/2014 | Peng |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,989,317 B1 | 3/2015 | Holden |
| 9,036,764 B1 | 5/2015 | Hossain |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,148,087 B1 | 9/2015 | Tajalli |
| 9,152,495 B2 | 10/2015 | Losh |
| 9,178,503 B2 | 11/2015 | Hsieh |
| 9,183,085 B1 | 11/2015 | Northcott |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,509,437 B2 | 11/2016 | Shokrollahi |
| 9,544,015 B2 | 1/2017 | Ulrich |
| 9,634,797 B2 | 4/2017 | Benammar |
| 2001/0055344 A1* | 12/2001 | Lee .................. H04L 25/14 375/257 |
| 2002/0034191 A1 | 3/2002 | Shattil |
| 2002/0044316 A1 | 4/2002 | Myers |
| 2002/0057292 A1 | 5/2002 | Holtz |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0046618 A1 | 3/2003 | Collins |
| 2003/0071745 A1 | 4/2003 | Greenstreet |
| 2003/0086366 A1 | 5/2003 | Branlund |
| 2003/0105908 A1 | 6/2003 | Perino et al. |
| 2003/0146783 A1 | 8/2003 | Bandy et al. |
| 2003/0185310 A1 | 10/2003 | Ketchum |
| 2003/0218558 A1 | 11/2003 | Mulder |
| 2003/0227841 A1 | 12/2003 | Tateishi et al. |
| 2004/0003336 A1 | 1/2004 | Cypher |
| 2004/0003337 A1 | 1/2004 | Cypher |
| 2004/0057525 A1 | 3/2004 | Rajan et al. |
| 2004/0086059 A1 | 5/2004 | Eroz et al. |
| 2004/0156432 A1 | 8/2004 | Hidaka |
| 2005/0057379 A1 | 3/2005 | Jansson |
| 2005/0135182 A1 | 6/2005 | Perino et al. |
| 2005/0149833 A1 | 7/2005 | Worley |
| 2005/0152385 A1 | 7/2005 | Cioffi |
| 2005/0174841 A1 | 8/2005 | Ho |
| 2005/0195000 A1 | 9/2005 | Parker |
| 2005/0201491 A1 | 9/2005 | Wei |
| 2005/0220182 A1 | 10/2005 | Kuwata |
| 2005/0286643 A1 | 12/2005 | Ozawa et al. |
| 2006/0036668 A1 | 2/2006 | Jaussi |
| 2006/0115027 A1 | 6/2006 | Srebranig |
| 2006/0126751 A1 | 6/2006 | Bessios |
| 2006/0140324 A1 | 6/2006 | Casper |
| 2006/0159005 A1 | 7/2006 | Rawlins et al. |
| 2006/0233291 A1 | 10/2006 | Garlepp |
| 2007/0001723 A1 | 1/2007 | Lin |
| 2007/0002954 A1 | 1/2007 | Cornelius |
| 2007/0103338 A1 | 5/2007 | Teo |
| 2007/0188367 A1 | 8/2007 | Yamada |
| 2007/0260965 A1 | 11/2007 | Schmidt et al. |
| 2007/0263711 A1 | 11/2007 | Kramer et al. |
| 2007/0265533 A1 | 11/2007 | Tran |
| 2007/0283210 A1 | 12/2007 | Prasad et al. |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0169846 A1 | 7/2008 | Lan et al. |
| 2008/0273623 A1 | 11/2008 | Chung et al. |
| 2008/0284524 A1 | 11/2008 | Kushiyama |
| 2008/0317188 A1 | 12/2008 | Staszewski |
| 2009/0059782 A1 | 3/2009 | Cole |
| 2009/0092196 A1 | 4/2009 | Okunev |
| 2009/0115523 A1 | 5/2009 | Akizuki |
| 2009/0132758 A1 | 5/2009 | Jiang |
| 2009/0154500 A1 | 6/2009 | Diab et al. |
| 2009/0163612 A1 | 6/2009 | Brady |
| 2009/0185636 A1 | 7/2009 | Palotai et al. |
| 2009/0193159 A1 | 7/2009 | Li |
| 2009/0212861 A1 | 8/2009 | Lim et al. |
| 2009/0228767 A1 | 9/2009 | Oh et al. |
| 2009/0257542 A1* | 10/2009 | Evans .................. H03L 7/07 375/375 |
| 2009/0262876 A1 | 10/2009 | Arima |
| 2009/0323864 A1 | 12/2009 | Tired |
| 2010/0023838 A1 | 1/2010 | Shen |
| 2010/0081451 A1 | 4/2010 | Mueck |
| 2010/0104047 A1 | 4/2010 | Chen et al. |
| 2010/0122021 A1 | 5/2010 | Lee |
| 2010/0148819 A1 | 6/2010 | Bae |
| 2010/0180143 A1 | 7/2010 | Ware et al. |
| 2010/0205506 A1 | 8/2010 | Hara |
| 2010/0215112 A1 | 8/2010 | Tsai |
| 2010/0296550 A1 | 11/2010 | Abou Rjeily |
| 2010/0296556 A1 | 11/2010 | Rave |
| 2011/0051854 A1 | 3/2011 | Kizer et al. |
| 2011/0072330 A1 | 3/2011 | Kolze |
| 2011/0084737 A1 | 4/2011 | Oh et al. |
| 2011/0103508 A1 | 5/2011 | Mu |
| 2011/0127990 A1 | 6/2011 | Wilson et al. |
| 2011/0228864 A1 | 9/2011 | Aryanfar |
| 2011/0235501 A1 | 9/2011 | Goulahsen |
| 2011/0268225 A1 | 11/2011 | Cronie et al. |
| 2011/0299555 A1 | 12/2011 | Cronie et al. |
| 2011/0302478 A1 | 12/2011 | Cronie et al. |
| 2011/0317559 A1 | 12/2011 | Kern et al. |
| 2012/0063291 A1 | 3/2012 | Hsueh |
| 2012/0082203 A1 | 4/2012 | Zerbe |
| 2012/0152901 A1 | 6/2012 | Nagorny |
| 2012/0161945 A1 | 6/2012 | Single |
| 2012/0213299 A1 | 8/2012 | Cronie et al. |
| 2013/0010892 A1 | 1/2013 | Cronie et al. |
| 2013/0013870 A1 | 1/2013 | Cronie |
| 2013/0051162 A1 | 2/2013 | Amirkhany et al. |
| 2013/0114519 A1 | 5/2013 | Gaal |
| 2013/0129019 A1 | 5/2013 | Sorrells |
| 2013/0195155 A1 | 8/2013 | Pan |
| 2013/0202065 A1 | 8/2013 | Chmelar |
| 2013/0271194 A1 | 10/2013 | Pellerano |
| 2013/0314142 A1 | 11/2013 | Tamura |
| 2014/0159769 A1 | 6/2014 | Hong |
| 2014/0226455 A1 | 8/2014 | Schumacher |
| 2014/0254730 A1 | 9/2014 | Kim et al. |
| 2015/0010044 A1 | 1/2015 | Zhang |
| 2015/0070201 A1 | 3/2015 | Dedic |
| 2015/0078479 A1 | 3/2015 | Whitby-Stevens |
| 2015/0146771 A1 | 5/2015 | Walter |

(56) References Cited

U.S. PATENT DOCUMENTS

| | | | |
|---|---|---|---|
| 2015/0222458 | A1 | 8/2015 | Hormati |
| 2015/0249559 | A1 | 9/2015 | Shokrollahi |
| 2015/0333940 | A1 | 11/2015 | Shokrollahi |
| 2015/0381232 | A1 | 12/2015 | Ulrich |
| 2016/0020796 | A1 | 1/2016 | Hormati |
| 2016/0020824 | A1 | 1/2016 | Ulrich |
| 2016/0036616 | A1 | 2/2016 | Holden |
| 2016/0261435 | A1 | 9/2016 | Musah |
| 2017/0310456 | A1 | 10/2017 | Tajalli |
| 2017/0317449 | A1 | 11/2017 | Shokrollahi |
| 2017/0317855 | A1 | 11/2017 | Shokrollahi |

FOREIGN PATENT DOCUMENTS

| | | |
|---|---|---|
| EP | 1926267 | 5/2008 |
| EP | 2039221 B1 | 3/2009 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

International Search Report and Written Opinion of the International Searching Authority, dated Nov. 5, 2012, in International Patent Application S.N. PCT/EP2012/052767, 7 pages.

International Search Report and Written Opinion of the International Searching Authority, dated Jul. 14, 2011 in International Patent Application S.N. PCT/EP2011/002170, 10 pages.

Healey, A., et al., "A Comparison of 25 Gbps NRZ & PAM-4 Modulation used in Legacy & Premium Backplane Channels", DesignCon 2012, 16 pages.

International Search Report for PCT/US2014/053563, dated Nov. 11, 2014, 2 pages.

Clayton, P., "Introduction to Electromagnetic Compatibility", Wiley-Interscience, 2006.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Poulton, et al., "Multiwire Differential Signaling", UNC-CH Department of Computer Science Version 1.1, Aug. 6, 2003.

Skliar et al., A Method for the Analysis of Signals: the Square-Wave Method, Mar. 2008, Revista de Matematica: Teoria y Aplicationes, pp. 09-129.

International Search Report and Written Opinion from PCT/US2014/034220 dated Aug. 21, 2014.

Burr, "Spherical Codes for M-ARY Code Shift Keying", University of York, Apr. 2, 1989, pp. 67-72, United Kingdom.

Slepian, D., "Premutation Modulation", IEEE, vol. 52, No. 3, Mar. 1965, pp. 228-236.

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallani, L., et al., "Transmission Time Analysis for the Parallel Asynchronous Communication Scheme", IEEE Tranactions on Computers, vol. 52, No. 5, May 2003, pp. 558-571.

International Search Report and Written Opinion for PCT/EP2012/052767 dated May 11, 2012.

International Search Report and Written Opinion for PCT/EP2011/059279 dated Sep. 22, 2011.

International Search Report and Written Opinion for PCT/EP2011/074219 dated Jul. 4, 2012.

Notification of Transmittal of the International Search Report and the Written Opinion of the International Searching Authority, or the Declaration for PCT/EP2013/002681, dated Feb. 25, 2014, 15 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Integration (VLSI) Systems, vol. 14, No. 4, Apr. 2006, pp. 393-406.

Abbasfar, A., "Generalized Differential Vector Signaling", IEEE International Conference on Communications, ICC '09, (Jun. 14, 2009), pp. 1-5.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Wang et al., "Applying CDMA Technique to Network-on-Chip", IEEE Transactions on Very Large Scale Integration (VLSI) Systems, vol. 15, No. 10 (Oct. 1, 2007), pp. 1091-1100.

Cheng, W., "Memory Bus Encoding for Low Power: A Tutorial", Quality Electronic Design, IEEE, International Symposium on Mar. 26-28, 2001, pp. 199-204, Piscataway, NJ.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Notification of Transmittal of International Search Report and the Written Opinion of the International Searching Authority, for PCT/US2015/018363, dated Jun. 18, 2015, 13 pages.

Counts, L., et al., "One-Chip Slide Rule Works with Logs, Antilogs for Real-Time Processing," Analog Devices Computational Products 6, Reprinted from Electronic Design, May 2, 1985, 7 pages.

Design Brief 208 Using the Anadigm Multiplier CAM, Copyright 2002 Anadigm, 6 pages.

Grahame, J., "Vintage Analog Computer Kits," posted on Aug. 25, 2006 in Classic Computing, 2 pages, http.//www.retrothing.com/2006/08/classic_analog_.html.

Schneider, J., et al., "ELEC301 Project: Building an Analog Computer," Dec. 19, 1999, 8 pages, http://www.clear.rice.edu/elec301/Projects99/anlgcomp/.

Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.

"Introduction to: Analog Computers and the DSPACE System," Course Material ECE 5230 Spring 2008, Utah State University, www.coursehero.com, 12 pages.

Notification of Transmittal of the International Search Report and the Written Opinion of the International Searching Authority, or the Declaration, for PCT/US2014/015840, dated May 20, 2014. 11 pages.

Notification of Transmittal of the International Search Report and the Written Opinion of the International Searching Authority, or the Declaration, for PCT/US2014/043965, dated Oct. 22, 2014, 10 pages.

Notification of Transmittal of the International Search Report and the Written Opinion of the International Searching Authority, or the Declaration, dated Mar. 3, 2015, for PCT/US2014/066893, 9 pages.

International Preliminary Report on Patentability for PCT/US2014/015840, dated Aug. 11, 2015, 7 pages.

Jiang, A., et al., "Rank Modulation for Flash Memories", IEEE Transactions of Information Theory, Jun. 2006, vol. 55, No. 6, pp. 2659-2673.

Zouhair Ben-Neticha et al, "The streTched—Golay and other codes for high-SNR finite-delay quantization of the Gaussian source at ½ Bit per sample", IEEE Transactions on Communications, vol. 38, No. 12 Dec. 1, 1990, pp. 2089-2093, XP000203339, ISSN: 0090-6678, DOI: 10.1109/26.64647.

Oh, et al., Pseudo-Differential Vector Signaling for Noise Reduction in Single-Ended Signaling, DesignCon 2009.

Notification of Transmittal of the International Search Report and the Written Opinion of the International Searching Authority, or the Declaration, dated Feb. 15, 2017, 10 pages.

Notification of Transmittal of the International Search Report and the Written Opinion of the International Searching Authority, or the Declaration, for PCT/US2015/039952, dated Sep. 23, 2015, 8 pages.

(56) References Cited

OTHER PUBLICATIONS

Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration., for PCT/US17/14997, dated Apr. 7, 2017, 10 pages.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

\* cited by examiner

DATA-DRIVEN VOLTAGE REGULATOR

CROSS REFERENCES

The following application claims the priority benefit of U.S. provisional application Ser. 61/870,612, filed on Aug. 27, 2013, which is incorporated herein. The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. Provisional Patent Application No. 61/753,870, filed Jan. 17, 2013, naming John Fox, Brian Holden, Peter Hunt, John D. Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I");

U.S. Provisional Patent Application No. 61/763,403, filed Feb. 11, 2013, naming John Fox, Brian Holden, Ali Hormati, Peter Hunt, John D. Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II").

U.S. Provisional Patent Application No. 61/773,709, filed Mar. 6, 2013, naming John Fox, Brian Holden, Peter Hunt, John D. Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III").

The following additional reference to prior art has been cited in this application:

"A 0.54pJ/b 20 Gb/s Ground-Referenced Single-Ended Short-Haul Serial link in 28 nm CMOS for Advanced Packaging Applications", John W. Poulton, William J. Dally, Xi Chen, John G. Eyles, Thomas H. Greer III, Stephen G. Tell, C. Thomas Gray, 2013 IEEE International Solid-State Circuits Conference, Session 23.3 p. 404 (hereinafter called "Poulton I").

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions.) The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is $2^8$, or 256.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, Fox I, Fox II, and Fox III.

BRIEF SUMMARY

In accordance with at least one embodiment of the invention, processes and apparatuses provide for transmitting data over physical channels to provide a high speed, low latency interface providing high total bandwidth with high energy efficiency, such as to interconnect integrated circuit chips in a multi-chip system. In some embodiments, different voltage, current, etc. levels are used for signaling and more than two levels may be used, such as a ternary vector signaling code wherein each wire signal has one of three values, or a quaternary signaling system wherein each wire signal has one of four values. To further reduce power consumption for the communications interface, one or more of the extreme wire signal values may also be represented by reduced voltages, compared to the available power supply levels provided to the communicating device or devices from external sources.

As one example provided for purposes of description and without limitation, a reduced-swing ternary signaling scheme may utilize levels of Vdd/2, Vdd/4, and Vss. In such a scheme, the intermediate Vdd/4 value may be derived efficiently from the more extreme levels using the methods taught in Simpson I, but the extreme Vdd/2 value would in usual practice be obtained from an inefficient on-chip voltage regulator, or would require dedication of new chip pin(s) connecting to a further external power source of that value.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

DETAILED DESCRIPTION

Despite the increasing technological ability to integrate entire systems into a single integrated circuit, multiple chip systems and subsystems retain significant advantages. The physical infrastructure to support high-bandwidth chip-to-chip connectivity is available, if the power, complexity, and other circuit implementation issues for such interfaces can be resolved.

The basic requirements for such connectivity include high bandwidth (i.e., data throughput capacity), corresponding low communications latency, and low probability of error or data corruption. High bandwidth may be obtained by making the communications path extremely wide, by making the signaling rate extremely fast, or both. Pin limitations have historically constrained the use of wide interfaces, although technical advances such as flip chips, silicon interposers, and high-density interconnection wiring may now feasibly provide hundreds of physical chip-to-chip interconnection wires. However, even if such physical connectivity is possible, the power utilization and switching noise induced by simultaneous switched outputs (SSO) of many output pins may be intractable. Similarly, integrated circuit process technology now permits extremely high clock speeds to be used in serial line communications. However, these high speeds exacerbate signal integrity issues caused by interconnection impedance variations and signal crosstalk. Thus, it is observed that solutions capable of operating at moderately high speed and potentially wide interface width would be of particular value if they introduce minimal processing latency, mitigate SSO noise, and minimize transmit and receive power utilization.

General Assumptions

For purposes of comparison and without limitation, a reference interface design is assumed to use single-ended CMOS drivers to drive short non-terminated bussed or point-to-point interconnections, as is common practice. Inter-symbol interference and transmission line loss are considered to be small or negligible for the example use, and reference noise and thermal noise are considered to be tractable.

Figure 1:
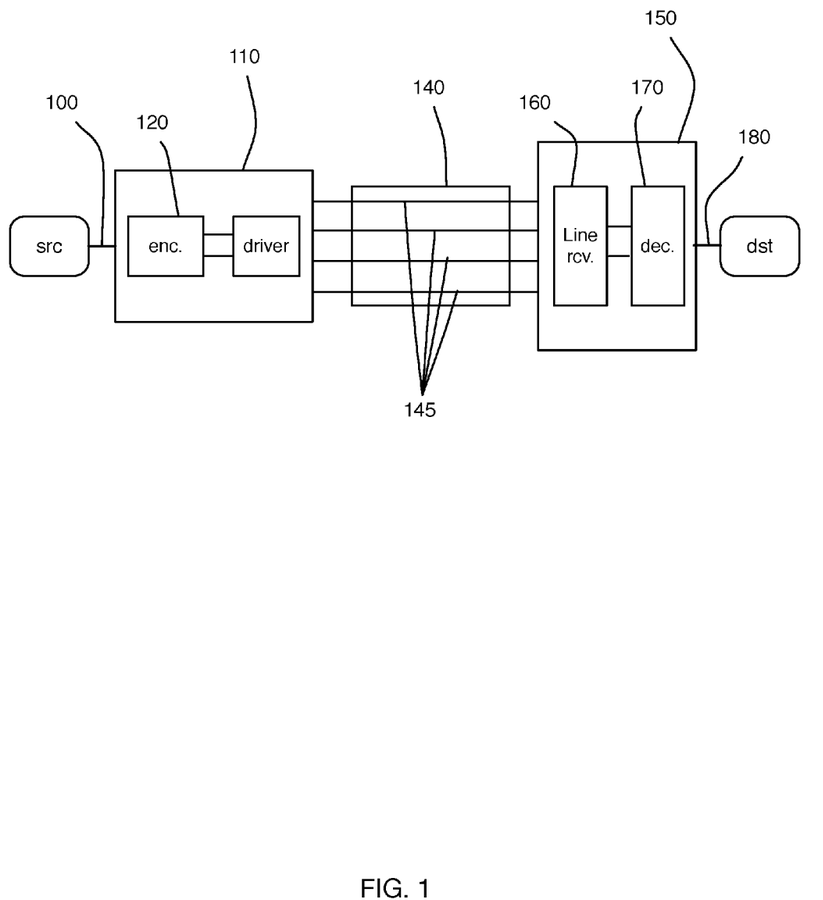
FIG. 1 is a block diagram of a communications system incorporating a multiple wire interconnection between transmitter and receiver.

Similarly, for purposes of description and without limitation, examples of various embodiments describing a particular physical interface width will assume data transfer occurs over one or more groups of signal wires or pins which may be proper subsets of the overall physical interface. The various examples presented herein utilize group or ensemble encoding of signals carried by such groups of signal wires or pins, also known as a vector signaling code. As shown in FIG. 1, the set of four wires 145 is used as a signaling group 140.

FIG. 1 is a schematic diagram of a system illustrating use of a vector signal encoder and a vector signal decoder. Bus transmitter 110 might include a vector signal encoder 120 and a bus driver, while bus receiver 150 might include a vector signal decoder 170 and a bus receiver 160. Vector signal encoder 120 encodes the information 100 provided by the source SRC into encoded information, while vector signal decoder 170 decodes signals provided by bus receiver 160 into decoded information 180 to provide to the destination device DST.

One of moderate skill in the art may easily apply the examples taught herein to applications with greater or lesser values for each such example constraint. Thus, as examples, vector signaling code words may be shorter or longer, be transmitted using fewer or larger numbers of wires, may utilize symbols of more than two values, transmission of which may require additional regulated voltages, etc.

Reduced Swing Signals

Unless otherwise specified, single-ended binary Full-Swing (FS) signaling assumes standard CMOS levels of 0*Vdd (which is typically equal to Vss) and 1*Vdd. It is noted that some embodiments incorporate separate supply pins for output drivers, either to mitigate issues of noise and power consumption, or to allow use of different core logic and I/O signal levels. For purposes of explanation, descriptions herein presume that FS signal levels comprise a gamut of two or more output levels substantially encompassing the range between power rails provided to the output drivers, whether those power rails are sourced from secondary power inputs dedicated to output driver use, or from the primary chip power inputs. ("Substantially", as technological issues such as transistor saturation voltage, output loading, and signal attenuation may constrain real-world Full-Swing outputs to a slightly smaller range than Vdd to Vss, as is well understood by one familiar with the art.)

Conversely, Reduced-Swing signaling use signal levels spanning a significantly narrower range than represented by Full-Swing signals. As examples and without limitation, one ternary RS signaling method may use signal levels of ½*Vdd, ¼*Vdd, and Vss, and a different binary RS signaling method may use signal levels of 200 mV and 0 mV.

Driver Power Consumption

In the case of a non-terminated CMOS binary driver, the main power drawn from the Vdd or positive supply rail is consumed in changing the voltage on the primarily capacitive load of the output line when the driver makes a transition from a lower state to a higher state. For a given load, the amount of consumed power is proportional to the magnitude of the transition. Stated differently, when transitioning from a state (x1, xk) to a following state (y1, yk) the driver power on k wires is proportional to the sum max(y1−x1, 0)+ . . . + max(yk−xk,0). This is independent of the particular reference chosen since the reference is canceled by taking differences. The power consumed by single-ended signals on k wires is between 0 and k, and the average power is k/4 since on a single wire a power consumption of 1 occurs only when transitioning from a 0 to a 1.

A similar calculation may be made to assess the power dissipated (or alternatively, the current injected into the Vss or ground rail) in changing the voltage on the primarily capacitive load of the output line when the driver makes a transition from a higher state to a lower state. In some embodiments, this flow of Vss or ground current may be as significant a design factor as the current drawn from the Vdd or supply rail.

For systems incorporating large numbers of interconnection wires, the total power required by all drivers may become quite significant, as may be commensurate system issues, including heat, noise, induced power supply transients, etc. Thus, solutions that significantly reduce power required by each driver, as described herein, are preferable over known solutions capable of providing some of the desired results with higher power utilization, such as using passive attenuators to produce reduced signal swing outputs.

Additional Driver Considerations

A conventional embodiment of a binary output driver is based on a CMOS inverter structure, where a totem pole pair of transistors is used to source current from the Vdd or positive supply rail to the output pin, or conversely to sink current from the output pin to the Vss or ground rail. Cascaded chains of inverters are commonly used, with the transistors at each stage being scaled up in size and current capability from the extremely low node capacitance and current demands of an internal circuit node, to the relatively massive capacitance and proportionately large current demands of the actual output pin and external load.

Figure 2A:
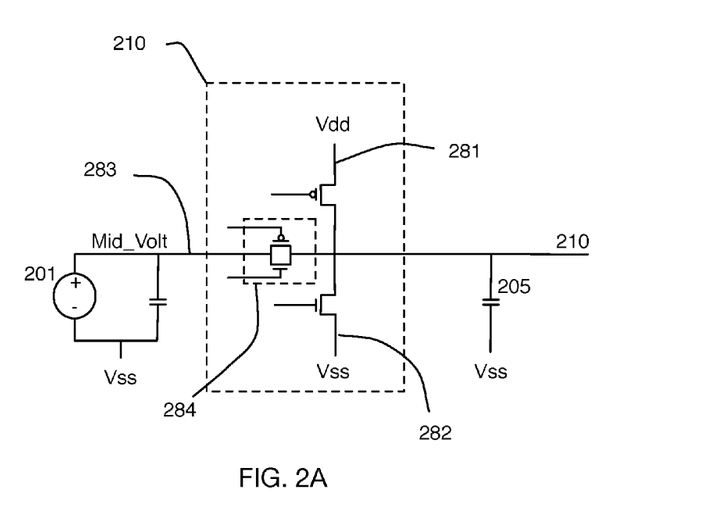
FIG. 2A shows schematic diagrams of a ternary line driver and selected signal waveforms from its operation.

One extension of this known design to support ternary output is shown in FIG. 2A, adding an additional intermediate level output element to the binary driver's single source 281 and single sink 282 transistors. Such intermediary-level outputs may be based on CMOS transmission gate structures such as 284 connecting an intermediate voltage rail Mid_Volt to the output pin, or may alternatively use a single transistor in a source follower topology from such an intermediate voltage rail. A source of regulated voltage 201 at an appropriate level must be provided to permit the third output level to be emitted.

Reduced-Swing embodiments may generate not only intermediary-level outputs but also one or both extreme output levels using such techniques. Using the earlier example of RS ternary signaling using levels of ½*Vdd, ¼*Vdd, and Vss, two distinct regulated voltages would be required for such a driver, one at ½*Vdd, and one at ¼*Vdd.

Output voltage levels other than those provided by external power inputs may be generated on-chip, or may be provided from an external source to the chip or shared among several chips. An internal voltage source may be shared across many output drivers (in one embodiment, by all drivers requiring that voltage level on a chip; in another embodiment, across multiple chips by use of one or more dedicated pins on each chip to provide the intermediate voltage and/or connection to external storage capacitance).

Linear regulator designs such as commonly used to regulate on-chip voltages represent current loads on their supply rail equal to the output current delivered. That is, linear regulation of, as an example, an input of Vdd 1.8 volts to an output of 0.8 volts at a load of 10 ma, will draw the same 10 ma from Vdd, dissipating 10 mw in the regulator's series pass transistor, a significant waste of power. More efficient switching regulator designs are known, but their use may be significantly constrained by the component limitations of on-chip embodiment.

Figure 2B:
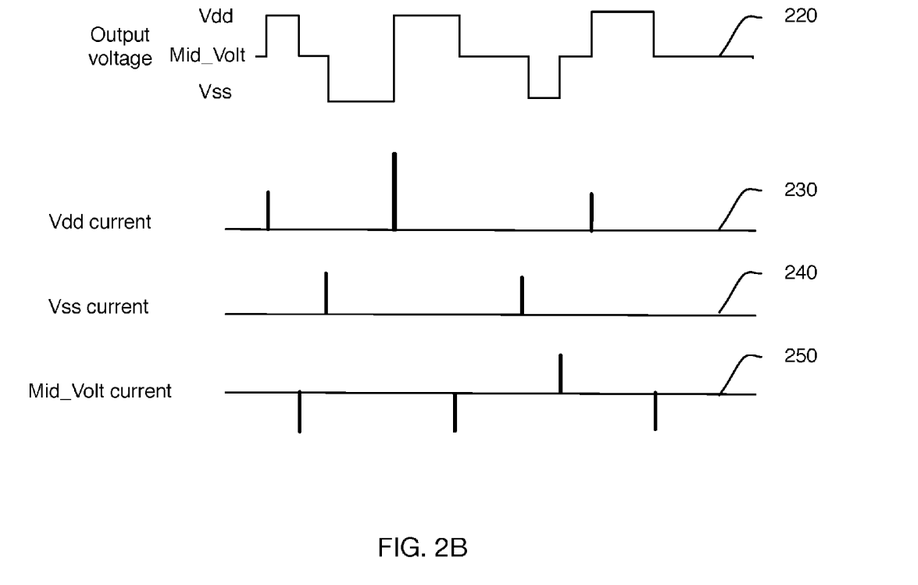
FIG. 2B is a signal diagram associated with the circuit of FIG. 2A.

Application of such known regulation solutions are further complicated by the time-varying nature of the load that is presented to them in the example applications described herein. Output wires being simultaneously driven to the same level appear as parallel loads to the common power source, thus the capacitive load presented to the regulator varies as a function of the particular data pattern being transmitted at that moment. Furthermore, the instantaneous regulator output current will depend on both the present data and data in the previous transmission interval, corresponding to the amount of charge to be sourced (or in some cases, sunk) from the capacitive load 205 by the output driver to achieve the desired output signal level on the wire or wires. This behavior is illustrated by the graphs of FIG. 2B. Each transition of output voltage 220 as measured at point 210 corresponds to a current spike on one of current graphs 230, 240, or 250; as examples, 230 showing current sourced from Vdd measured at point 281 for transitions to the + symbol value, 240 showing current sunk to Vss measured at point 282 for transitions to the − symbol value, and 250 showing current sunk by or sourced to Mid_Volt as measured at point 283 for transitions to the 0 symbol level respectively from a previous + or − level. These time-varying loads may induce instability in closed-loop regulation circuits, and may require the addition of significant regulated power bypass capacitance to avoid data-pattern-dependent output level modulation.

Data-Driven Voltage Regulator

Figure 3A:
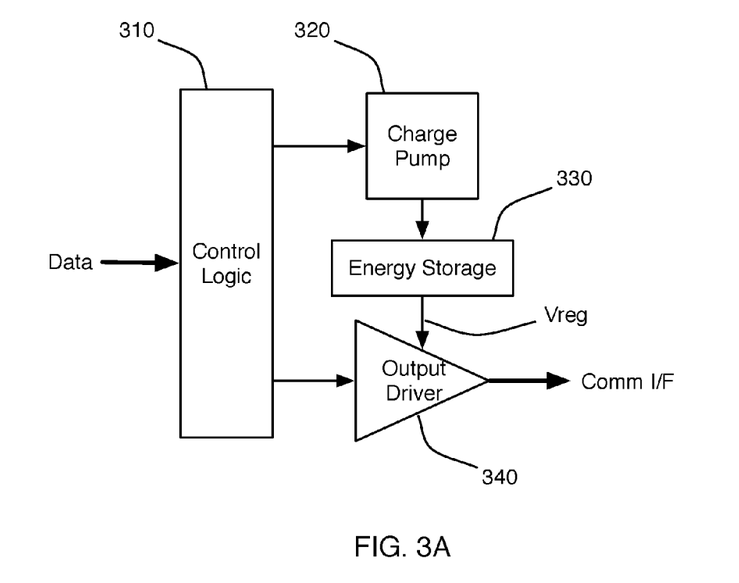
FIG. 3A illustrates a block diagram and functional model of a Reduced-Swing binary communications driver powered by a data-dependent charge pump voltage regulator.

The embodiment illustrated by the block diagram of FIG. 3A mitigates the data-dependent load issue by making the voltage regulation for the driver power source also data-dependent.

The source of at least one voltage required by output driver 340 is provided by an energy storage device 330 charged by charge pump 320. For the high-impedance loads under consideration, incremental output voltage changes between a known previous level and a desired new level may be modeled as a charge transfer operation. Control logic 310, monitoring both past and current input data values, determines the required charge transfer required to bring the Communications interface wire or wires to their required value, commands charge pump 320 to provide that amount of charge to energy storage 330, and then allows output driver 340 to transfer charge to the communications interface, producing the required output levels.

Figure 3B:
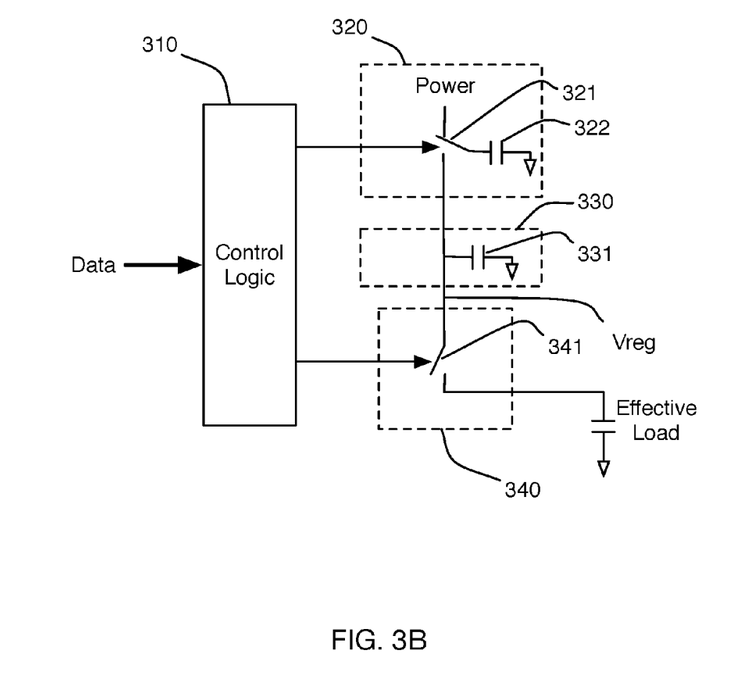
FIG. 3B is a single-ended signal circuit diagram in accordance with an embodiment.

Further details of operation are shown in the model of FIG. 3B. Here, the charge pump is represented as a switch 321 alternately charging capacitor 322 from a power source and discharging it as the charge pump output into energy storage 330 represented by capacitor 331. The output driver for this particular signal level is similarly modeled as a switch 341 under the control of logic 310, which allows the charge stored in capacitor 331 to be output to the effective load capacitance, producing the required output level.

Thus, the described embodiment operates in a fundamentally open-loop and data-driven mode, storing the charge required to transmit the required output level simultaneous with or in deterministic anticipation (that is, initiated by and in immediate anticipation of) its use by the driver. Unlike the charge pump described by Poulton I, which operates consistently on each transmit interval thus producing a constant load on the power supply, the described embodiment only draws power as determined by the particular data pattern to be transmitted, e.g. only drawing power for 0 to 1 output transitions, where the "1" value is the particular signal level generated by the charge pump voltage regulator.

Embodiments of the charge pump may be comprised of singular or plural switching elements, current sources, voltage sources, and capacitors. Embodiments of the control logic may perform the described actions only for particular output levels (i.e. to create a binary RS '1' output), for particular signal transitions (i.e. only for wire transitions from '0' to '1'), or for all levels or transitions. Switching elements may be embodied as field effect or bipolar transistors, or complimentary transistors in a transmission gate configuration. Further embodiments provide multiple instances of charge pumps, energy storage devices, and/or output driver switching elements to support additional controlled output levels, additional communications interface outputs, or both.

One familiar with the art will also observe that the described invention may be combined with embodiments that allows charge flow to also occur from communications interface wire or wires back into an energy storage device, allowing adiabatic recycling of energy expended in previous transmit intervals to power future ones.

Detailed Embodiment

Figure 4:
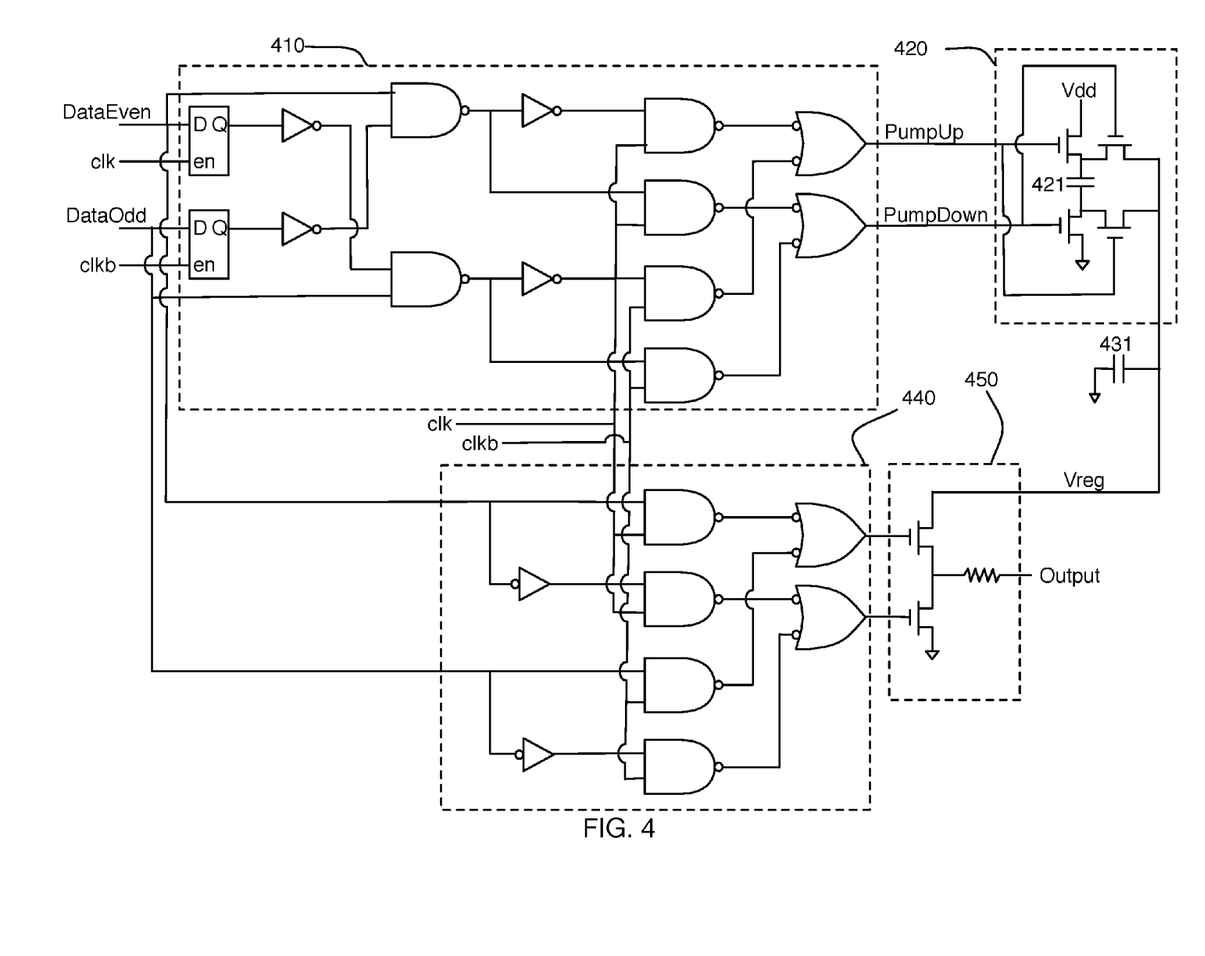
FIG. 4 is a schematic diagram of a Reduced-Swing binary communications driver powered by a data-dependent charge pump voltage regulator.

It is common practice for high-speed communications interfaces to internally multiplex multiple data streams operating at moderate rate into a high-speed communications stream. The detailed example embodiment shown in FIG. 4 shows two data streams at half the desired output rate identified as DataEven and DataOdd multiplexed using clocks clk and clkb into Output, a single Reduced Swing binary data stream at the full data rate. As will be understood by one familiar with the art, the described solution may also be applied to embodiments incorporating higher multiplexing levels and to single-stream embodiments.

Input data DataEven and DataOdd are latched by clocks clk and clkb as inputs into data-driven charge pump driver 410 controlling charge pump 420. Clocks clk and clkb may be non-overlapping or, preferably, complementary square waves. Circuit 410 identifies data transitions (that is, differences between data values to be transmitted consecutively) to produce two non-overlapping output pulses, PumpUp and PumpDown, for each transmit interval during which a previous data "zero" is followed by a data "one" in the combined data stream, corresponding to events where the load capacitance of the output wire must be transitioned from a low to a high value.

Figure 5:
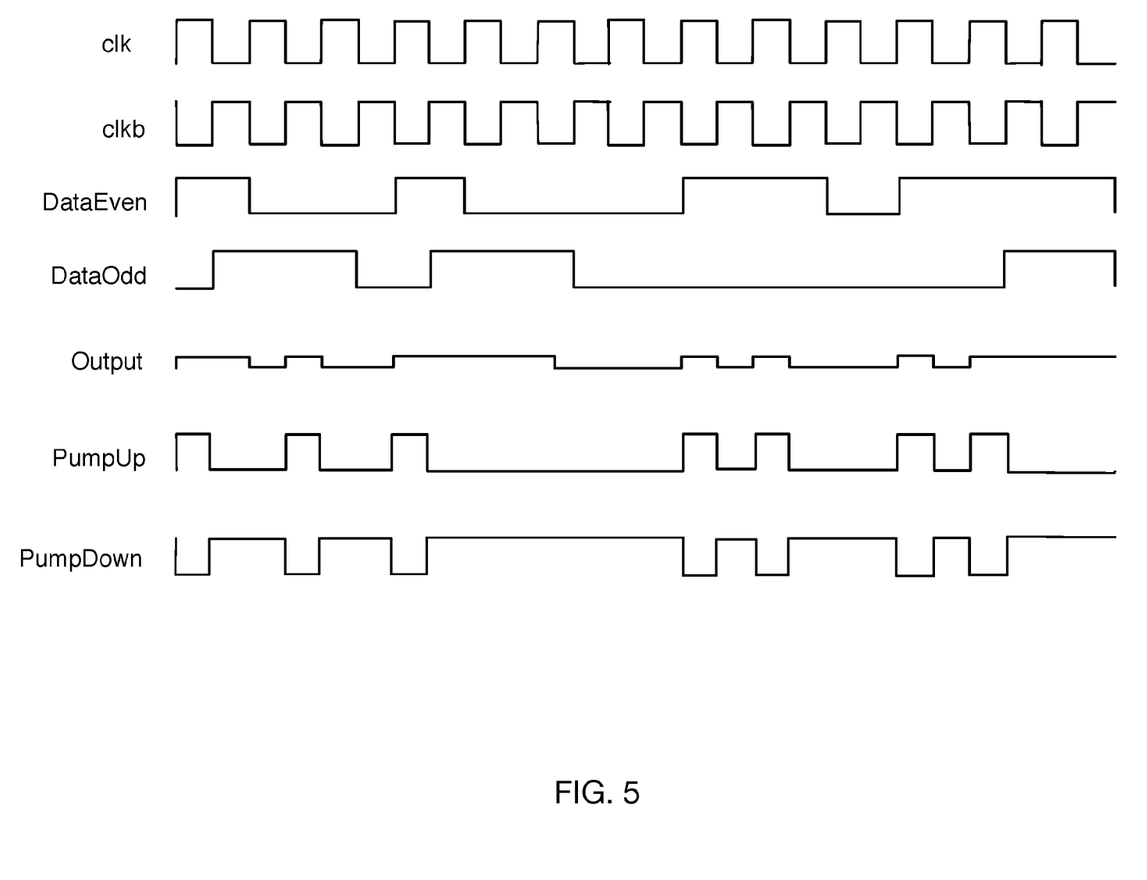
FIG. 5 shows a timing diagram for the embodiment of FIG. 4.

PumpUp causes flying capacitor 421 to be connected between Vdd and Vreg, allowing its charging current to flow into storage capacitor 431 for the duration of clk high. PumpDown then causes flying capacitor 421 to be connected between Vreg and Vss, directing its discharge current again into storage capacitor 431. Thus, in this example capacitor 431 receives two increments of current from capacitor 421 each time a zero-to-one transition occurs in the data stream. Concurrently, data multiplexer 440 combines the two half-rate data streams into a combined full-rate output stream that drives output stage 450 to either connect voltage source Vreg to Output for a data "one", or connect ground (Vss) to Output for a data "zero". FIG. 5 provides a timing diagram illustrating these operations in the embodiment of FIG. 4.

Note that consecutive "zero" or "one" values transmitted on Output are associated with substantially no driver current flow, one-to-zero transitions of Output cause driver current flow from Output to ground only, and zero-to-one transitions cause the driver to draw current from Vreg and capacitor 331. Thus, events that cause current to be drawn from the internal regulated supply and storage capacitor 431 are balanced by events that cause current to be provided to storage capacitor 431.

At least one embodiment incorporates one instance of data-driven charge pump driver 410, charge pump 420, data multiplexer 440, and output stage 450 per output pin, with all outputs of at least the same vector signaling code sharing a common storage capacitor 421 and regulated power bus Vreg. In such embodiments, N outputs undergoing zero-to-one transitions are associated with N pairs of charge transfers into storage capacitor 431, as N outputs draw current from the regulated power bus, demonstrating that the varying load is appropriately compensated in an open-loop manner.

In one such embodiment, Vdd at 1.0 volt is converted to a regulated voltage of 200 millivolts using a flying capacitor of 2.25 pF and a storage capacitance of 20 pF, powering an output stage driving a wire load capacitance of 8 pF at a 1 Gbps data rate. Regulator current draw in this embodiment is approximately half that of an equivalent known art embodiment.

Alternative embodiments may utilize charge pumps providing a different charge transfer ratio or different number of transfer phases per data-driven operation. The voltage level produced at Output may be adjusted by trimming or selection of the charge pump capacitance, charging current, or charging cycle on time (depending on the type of charge pump used). Voltage levels may be adjusted as part of an initialization or communications channel training operation, may be measured or monitored locally, or may be measured or monitored using feedback from the receiver via a return signaling channel.

Additional Enhancements

Under some conditions, variation or modulation of the desired signal level may occur due to secondary effects, including inter-conductor coupling and leakage current. Communications protocols allowing long periods without output transitions may also result in voltage droop on the energy storage capacitor in the absence of charge pump activity. A conventional low-drop out (LDO) voltage regulator may be added, also providing synergistic value.

Figure 6A:
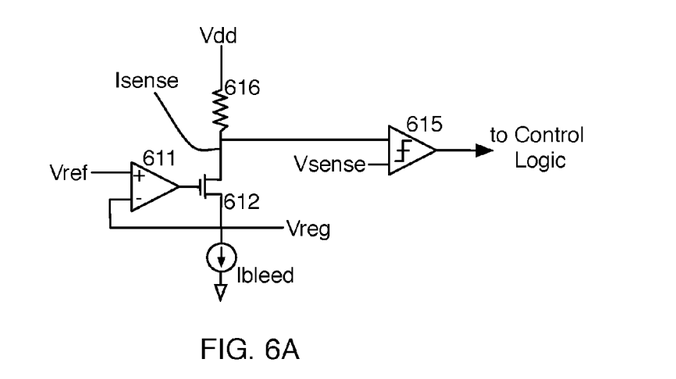
FIGS. 6A-C illustrates two examples as FIGS. 6A and 6B of auxiliary low-dropout regulators, and auxiliary control logic as FIG. 6C allowing the charge pump regulator to provide an equivalent function.

FIG. 6A is a schematic for a conventional LDO regulator, comprised of differential amplifier 611 driving source follower pass transistor 612 to produce regulated voltage Vreg matching reference voltage Vref. The leakage current of the driver is shown as Ibleed. Digital comparator 615 and voltage reference Vsense may be used to measure LDO regulator current, which under desired operating conditions will be no more than Ibleed, as the actual output driver current should be provided by the charge pump component of the data-dependent voltage regulator paralleled with this circuit.

This measurement information may be used, as previously described, to trim or adjust the capacitance or other characteristics of the charge pump to obtain this desired operating condition. As one example, an initialization procedure may toggle individual outputs and monitor comparator results as each associated charge pump is trimmed.

Figure 6B:
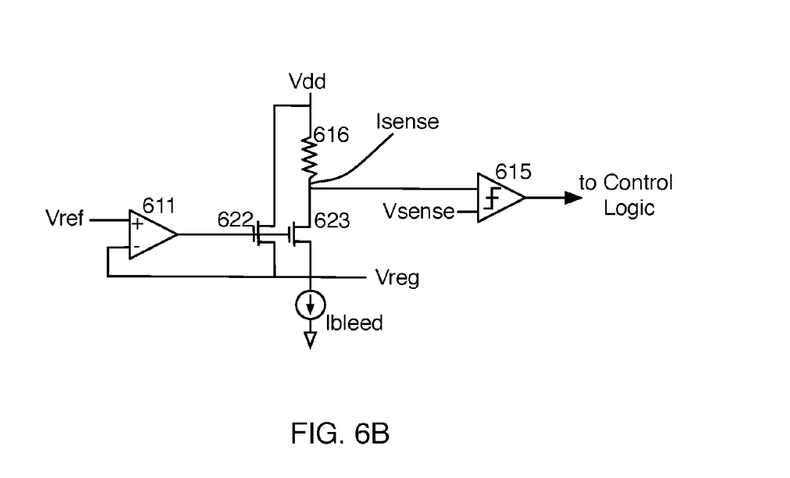

The decoupling provided by source follower of FIG. 6A allows the differential amplifier to have fast response, but the presence of sense resistor 616 limits the maximum current that can be produced. FIG. 6B illustrates a variation using split transistors 622/623 in the source follower to permit current sensing with increased output current capabilities. Those familiar with the art will recognize that the split transistors may be identical or may be ratiometrically scaled, so as to produce a known proportional factor between measured and total output current.

Figure 6C:
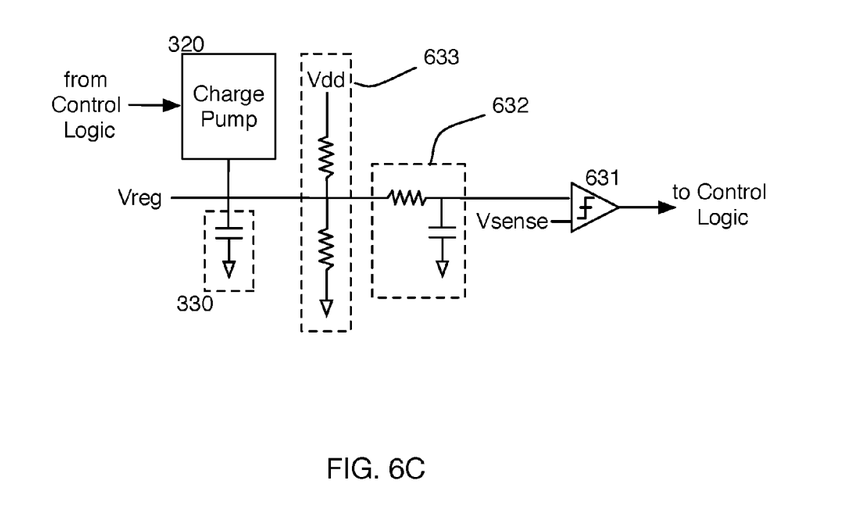

As an alternative to adding a discrete LDO, the control logic controlling the charge pump as previously shown in FIGS. 3A and 3B may be augmented as illustrated in FIG. 6C. Analog comparator 631 compares regulated voltage Vreg (optionally, through ripple filter 632) with reference voltage Vref, providing an indication to the control logic as to whether leakage or drift has impacted the storage capacitance 330 voltage. If so, the control logic may initiate one or more charge pump cycles to bring Vreg up to the desired value, mimicking the operational behavior of the LDO. The control logic may similarly use the output of 631 to trim charge pump 320, as previously described. Optional ripple filter 632 may be incorporated to eliminate measurement aliasing. An optional passive voltage divider 633 may also be incorporated to prevent Vreg from floating away during long periods of idle charge pump activity. The current through 633 need only cover leakage currents, typically on the order of 10 uA, so should not have significant impact on power consumption.

The examples presented herein illustrate the use of vector signaling codes communicated via high impedance parallel interconnections and data-driven low power voltage regulators for chip-to-chip interconnection. However, those exemplary details should not been seen as limiting the scope of the described invention. The methods disclosed in this application are equally applicable to other interconnection topologies and other communication media including optical, capacitive, inductive, and wireless communications which may rely on any of the characteristics of the described invention, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "physical signal" includes any suitable behavior and/or attribute of a physical phenomenon capable of conveying information. Physical signals may be tangible and non-transitory.

I claim:

1. An apparatus comprising:
an energy storage element;
a control circuit configured to determine respective magnitudes of one or more signal transmission level changes associated with one or more communications interface output drivers in response to a change in input data, and to responsively provide one or more data-driven charge pump control signals and one or more driver control signals;
a data-driven charge pump circuit comprising one or more charge pump circuits each having a control input node for receiving a respective data-driven charge pump control signal of the one or more data-driven charge pump control signals, each charge pump circuit being configured to selectively pre-charge the energy storage element in response to the respective data-driven charge-pump control signal applied to the control input node by transferring a respective amount of charge to the energy storage element, the respective amount of charge transferred indicative of the respective magnitude of a corresponding signal transmission level change; and
the one or more communications interface output drivers each connected to (i) a respective signal line of a set of one or more signal lines and (ii) the energy storage element, each communications interface output driver configured to receive a corresponding driver control signal and to selectively transfer a portion of charge stored in the energy storage element to the respective signal line in response to the corresponding driver control signal.

2. The apparatus of claim 1, wherein the control circuit is configured to receive transmit data and transmit clock signals to determine the respective magnitudes of the one or more signal transmission level changes.

3. The apparatus of claim 2 wherein the transmit data signals include even data signals and odd data signals, and the control circuit is configured to determine the respective magnitudes of the signal transmission level changes between the even data signal and a subsequent odd data signal and between the odd data signal and a subsequent even data signal.

4. The apparatus of claim 3 further comprising a data multiplexer circuit having a multiplexed output connected to the one or more communications interface output drivers, and configured to combine the even data signals and odd data signals into a single data stream.

5. The apparatus of claim 1 wherein the determined magnitude of a given signal transmission level change is a low-to-high transition, and at least one charge pump circuit is configured to charge a capacitor in the energy storage element during a signaling interval not associated with a low-to-high transition.

6. The apparatus of claim 1 further comprising a voltage regulator connected to the energy storage element to maintain a desired voltage at the energy storage element.

7. The apparatus of claim 1 further comprising a comparator having a first input connected to the energy storage element and a second input connected to a reference voltage signal and a comparator output connected to the control circuit, wherein the control circuit initiates one or more charge pump cycles in response to the to the comparator output.

8. The apparatus of claim 1 wherein each of the one or more communications interface output drivers shares a single energy storage element, and wherein the control circuit is configured to provide a data-driven charge pump control signal only to charge pumps associated with communications interface output drivers having a low-to-high signal transmission level change.

9. A method comprising:
   detecting, using a control circuit, a predetermined data sequence within a received data signal associated with a low-to-high signal transmission level change on at least one of the one or more signal lines;
   responsive to detecting the predetermined data sequence, providing data-driven charge pump control signals to a data-driven charge pump to pre-charge an energy storage element with an amount of energy determined by the low-to-high signal transmission level change on the at least one of the one or more signal lines; and
   outputting signal transmission levels from an output driver over the one or more signal lines, wherein the output driver uses energy selectively transferred from the energy storage element for establishing at least one low-to-high signal transmission level change on the one or more signal lines.

10. The method of claim 9, wherein the data signal includes even data signals and odd data signals, and the predetermined data sequence is a predetermined change between the even data signal and a subsequent odd data signal or a predetermined change between the odd data signal and a subsequent even data signal.

11. The method of claim 9 further comprising multiplexing even data signals and odd data signals into a single data stream.

12. The method of claim 9 further comprising using a voltage regulator connected to the energy storage element to maintain a desired average voltage at the energy storage element.

13. The method of claim 9 further comprising:
   generating a comparison signal between a voltage associated with the energy storage element and a reference voltage signal; and
   initiating one or more charge pump cycles in response to the comparison signal.

14. The method of claim 9 wherein providing the data-driven charge pump control signals comprises combining at least one clock signal with a logic circuit output indicative of a low-to-high transmission signal level change.

* * * * *